(12) United States Patent
Liu et al.

(10) Patent No.: US 11,469,240 B2
(45) Date of Patent: Oct. 11, 2022

(54) MEMORY DEVICE AND HYBRID SPACER THEREOF

(71) Applicant: Yangtze Memory Technologies Co., Ltd., Wuhan (CN)

(72) Inventors: Liheng Liu, Wuhan (CN); Chuan Yang, Wuhan (CN); Shuangshuang Peng, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 16/889,006

(22) Filed: Jun. 1, 2020

(65) Prior Publication Data

US 2021/0159236 A1     May 27, 2021

Related U.S. Application Data

(63) Continuation of application No. PCT/CN2019/120318, filed on Nov. 22, 2019.

(51) Int. Cl.
| | |
|---|---|
| *H01L 27/1157* | (2017.01) |
| *H01L 27/11524* | (2017.01) |
| *H01L 27/11578* | (2017.01) |
| *H01L 21/28* | (2006.01) |
| *H01L 27/11551* | (2017.01) |

(52) U.S. Cl.
CPC .. *H01L 27/11524* (2013.01); *H01L 21/28141* (2013.01); *H01L 27/1157* (2013.01); *H01L 27/11551* (2013.01); *H01L 27/11578* (2013.01)

(58) Field of Classification Search
CPC ........... H01L 27/11524; H01L 27/1157; H01L 27/11551; H01L 21/28141; H01L 27/11582; H01L 27/11578; H01L 27/11563; H01L 21/823475; H01L 27/11568
See application file for complete search history.

(56) References Cited

U.S. PATENT DOCUMENTS

2004/0082126 A1    4/2004  Park et al.
2006/0244100 A1*  11/2006  Ahn .................. C23C 16/45529
                                                257/532
(Continued)

FOREIGN PATENT DOCUMENTS

CN         1457508 A      11/2003
CN       106024893 A      10/2016
(Continued)

OTHER PUBLICATIONS

The World Intellectual Property Organization (WIPO) International Search Report for PCT/CN2019/120318 dated Aug. 25, 2020 4 pages.

*Primary Examiner* — Shahed Ahmed
*Assistant Examiner* — Khatib A Rahman
(74) *Attorney, Agent, or Firm* — Anova Law Group, PLLC

(57) ABSTRACT

A semiconductor device includes a metal layer and a spacer arranged adjacent to the metal layer. The spacer includes a composite-dielectric layer including a composite-dielectric material. A composition of the composite-dielectric material is a mixture of a composition of a first dielectric material and a composition of a second dielectric material different from the first dielectric material.

20 Claims, 11 Drawing Sheets

(56) References Cited

U.S. PATENT DOCUMENTS

| | | | |
|---|---|---|---|
| 2009/0108334 A1* | 4/2009 | Joo | H01L 29/792 |
| | | | 257/326 |
| 2016/0379989 A1* | 12/2016 | Sharangpani | H01L 21/31155 |
| | | | 438/269 |
| 2017/0098656 A1* | 4/2017 | Son | G11C 16/0466 |
| 2017/0250193 A1* | 8/2017 | Huo | H01L 21/3247 |
| 2019/0109150 A1* | 4/2019 | Mori | H01L 27/11524 |
| 2020/0035700 A1 | 1/2020 | Xu et al. | |
| 2020/0243664 A1* | 7/2020 | Chuang | H01L 29/66636 |
| 2020/0286530 A1* | 9/2020 | Lee | H01L 27/11573 |

FOREIGN PATENT DOCUMENTS

| | | |
|---|---|---|
| CN | 106158729 A | 11/2016 |
| CN | 109075168 A | 12/2018 |
| CN | 109300900 A | 2/2019 |
| TW | 200302547 A | 8/2003 |

\* cited by examiner

MEMORY DEVICE AND HYBRID SPACER THEREOF

CROSS-REFERENCE TO RELATED APPLICATION

This application is a continuation of International Application No. PCT/CN2019/120318, filed Nov. 22, 2019, the entire content of which is incorporated herein by reference.

FIELD OF THE TECHNOLOGY

This application relates to the field of memory devices and, more particularly, to a hybrid spacer structure and a memory device having the hybrid spacer structure.

BACKGROUND OF THE DISCLOSURE

Three-dimensional (3D) memory devices, such as 3D NAND memory devices, are promising memory devices with the potential of having a much higher storage density than conventional planar memories. A 3D memory device usually includes multiple layers of memory cells each having a gate, which is isolated by a spacer from a slit contact structure.

In the 3D memory device, the gates of the memory cells are usually formed of tungsten (W) and the spacer is usually formed of silicon oxide ($SiO_2$). Tungsten is usually deposited using a chemical vapor deposition (CVD) or an atomic layer deposition (ALD) process, with tungsten hexafluoride ($WF_6$) included in the reaction gas for the deposition process as the source of tungsten. During the deposition process, $WF_6$ decomposes and fluorine is released. The released fluorine can be trapped in voids in the tungsten gates or in the bulk tungsten material itself. During later high-temperature processes or operations, the trapped fluorine will out gas and damage the spacer made of silicon oxide or other parts of the memory device, causing, e.g., current leakage.

SUMMARY

In accordance with the disclosure, there is provided a semiconductor device including a metal layer and a spacer arranged adjacent to the metal layer. The spacer includes a composite-dielectric layer including a composite-dielectric material. A composition of the composite-dielectric material is a mixture of a composition of a first dielectric material and a composition of a second dielectric material different from the first dielectric material.

Also in accordance with the disclosure, there is provided a method of forming a semiconductor device including forming a metal layer over a substrate, forming a first dielectric layer over the metal layer, forming a second dielectric layer over the first dielectric layer, and performing an annealing treatment. The first dielectric layer includes a first dielectric material and the second dielectric layer includes a second dielectric material different from the first dielectric material. The annealing treatment converts at least a portion of the first dielectric layer and at least a portion of the second dielectric layer that are adjacent to an interface between the first dielectric layer and the second dielectric layer into a composite-dielectric layer. The composite-dielectric layer includes a composite-dielectric material having a composition that is a mixture of a composition of the first dielectric material and a composition of the second dielectric material.

Also in accordance with the disclosure, there is provided a memory device including a substrate, a plurality of metal/dielectric tiers arranged over the substrate and each including a metal layer and an inter-metal dielectric layer, a via contact arranged through the metal/dielectric tiers, and a spacer arranged between the metal/dielectric tiers and the via contact. The spacer includes a composite-dielectric layer including a composite-dielectric material. A composition of the composite-dielectric material is a mixture of a composition of a first dielectric material and a composition of a second dielectric material different from the first dielectric material.

Also in accordance with the disclosure, there is provided a method of forming a memory device including forming a plurality of metal/dielectric tiers over a substrate, forming an opening extending through the metal/dielectric tiers, forming a first dielectric layer over at least an inner side wall of the opening, forming a second dielectric layer over the first dielectric layer, and performing an annealing treatment. The first dielectric layer includes a first dielectric material and the second dielectric layer includes a second dielectric material different from the first dielectric material. The annealing treatment converts at least a portion of the first dielectric layer and at least a portion of the second dielectric layer that are adjacent to an interface between the first dielectric layer and the second dielectric layer into a composite-dielectric layer. The composite-dielectric layer includes a composite-dielectric material having a composition that is a mixture of a composition of the first dielectric material and a composition of the second dielectric material.

DESCRIPTION OF EMBODIMENTS

The following describes the technical solutions in the embodiments of the present disclosure with reference to the accompanying drawings. Wherever possible, the same reference numbers will be used throughout the drawings to refer to the same or like parts. The described embodiments are merely some but not all of the embodiments of the present disclosure. Other embodiments obtained by a person skilled in the art based on the embodiments of the present disclosure without creative efforts shall fall within the scope of the present disclosure.

Unless otherwise defined, all the technical and scientific terms used herein have the same or similar meanings as generally understood by one of ordinary skill in the art. As described herein, the terms used in the specification of the present disclosure are intended to describe example embodiments, instead of limiting the present disclosure.

As used herein, when a first component is referred to as "fixed to" a second component, it is intended that the first component may be directly attached to the second component or may be indirectly attached to the second component via another component. When a first component is referred to as "connecting" to a second component, it is intended that the first component may be directly connected to the second component or may be indirectly connected to the second component via a third component between them. The terms "vertical," "horizontal," "perpendicular," "left," "right," and similar expressions used herein, are merely intended for purposes of description. The term "and/or" used herein includes any suitable combination of one or more related items listed.

In this disclosure, a value or a range of values may refer to a desired, target, or nominal value or range of values and can include slight variations. The term "about" or "approximately" associated with a value can allow a variation within, for example, 10% of the value, such as ±2%, ±5%, or ±10% of the value, or another proper variation as appreciated by one of ordinary skill in the art. The term "about" or "approximately" associated with a state can allow a slight deviation from the state. For example, a first component being approximately perpendicular to a second component can indicate that the first component is either exactly perpendicular to the second component or slightly deviates from being perpendicular to the second component, and an angle between the first and second components can be within a range from, e.g., 80° to 100°, or another proper range as appreciated by one of ordinary skill in the art.

Figure 1:
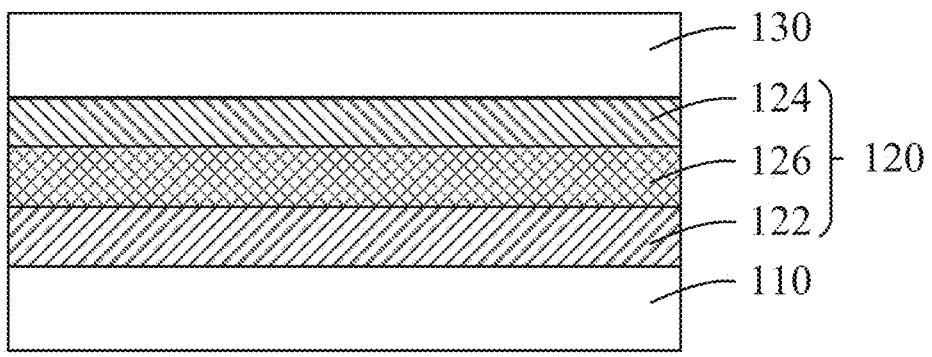
FIG. 1 is a cross-sectional view of a portion of a semiconductor device according to an embodiment of the disclosure.

FIG. 1 is a cross-sectional view of a portion of an example semiconductor device 100 consistent with embodiments of the disclosure. The semiconductor device 100 can be, e.g., a memory device, such as a three-dimensional (3D) NAND-type memory device. As shown in FIG. 1, the semiconductor device 100 includes a metal layer 110 and a hybrid spacer 120 arranged adjacent to the metal layer 110. In the example shown in FIG. 1, the hybrid spacer 120 is formed over an upper surface of the metal layer 110. In some other embodiments, the hybrid spacer 120 can be formed over another surface of the metal layer 110, such as a side surface of the metal layer 110, or be formed over more than one surfaces of the metal layer 110. Further, in the example shown in FIG. 1, the hybrid spacer 120 is in direct contact with the metal layer 110. In some other embodiments, the hybrid spacer 120 or a portion of the hybrid spacer 120 can be separated from the metal layer 110 by another intermediate layer, such as a thin buffer layer, or by a void space.

The metal layer 110 can include a metal and can be used as, e.g., a gate, of the semiconductor device 100. During the formation of the metal layer 110, some residual atoms from the source of the metal that are different from the metal atoms may remain in the metal layer 110 or be trapped by voids formed in the metal layer 110. These residual atoms may migrate to other parts of the semiconductor device 100 and cause degradation in properties or functionalities of these parts, or may even damage these parts. For example, the metal layer 110 can include tungsten (W) and the metal layer 110 can be formed by a chemical vapor deposition (CVD) method or an atomic layer deposition (ALD) method using tungsten hexafluoride ($WF_6$) as the source of tungsten. The fluorine (F) atoms may remain in the tungsten metal layer 110 or be trapped by voids in the tungsten metal layer 110.

Migration of the residual atoms from the metal layer 110, e.g., migration of the F atoms from the tungsten metal layer, to other parts of the semiconductor device 100 needs to be prevented to avoid damages to other parts of the semiconductor device 100 and degradation of the performance of the semiconductor device 100. Consistent with the disclosure, the hybrid spacer 120 can at least partially or even completely block the residual atoms, such as the F atoms, from migrating to other parts of the semiconductor device 100.

As shown in FIG. 1, the hybrid spacer 120 includes a first dielectric layer 122 at one side of the hybrid spacer 120 that is proximal to the metal layer 110, a second dielectric layer 124 at another side of the hybrid spacer 120 that is distal from the metal layer 110, and a composite-dielectric layer 126 sandwiched between the first dielectric layer 122 and the second dielectric layer 124.

According to the present disclosure, the first dielectric layer 122 and the second dielectric layer 124 can include different dielectric materials. The composite-dielectric layer 126 can include a composite material that is a composite of a first dielectric material of the first dielectric layer 122 and a second dielectric material of the second dielectric layer 124. For example, the composition of the composite material can be a mixture of the compositions of the dielectric materials of the first and second dielectric layers 122 and 124. The composite material of the composite-dielectric layer 126 is thus also referred to as a composite-dielectric material. In some embodiments, the composite-dielectric layer 126 can be formed by, e.g., annealing a layer of the first dielectric material and a layer of the second dielectric material formed one in contact with another, e.g., at an interface between the layer of the first dielectric material and the layer of the second dielectric material. In some embodiments, the composite-dielectric material can have a higher compactness (characterizing how closely the atoms in the material are packed), and hence higher airtightness, than the first and second dielectric materials.

In some embodiments, the first dielectric layer 122 can include, e.g., a zirconium oxide layer containing zirconium oxide ($ZrO_2$), and the second dielectric layer 124 can include, e.g., a silicon oxide layer containing silicon oxide ($SiO_2$). Correspondingly, the composite-dielectric layer 126 can include a Zr—O—Si composite-oxide layer containing Zr—O—Si (zirconium-oxygen-silicon) composite oxide, which can also be denoted as $Zr_xOSi_y$, with x and y indicating (e.g., proportional to) the mole amounts of Zr and Si in the composite oxide. In some embodiments, the mole ratio of Zr+Si to O in the composite oxide is approximately the same as the mole ratio of Zr to O in the zirconium oxide or the mole ratio of Si to O in the silicon oxide. That is, in these embodiments, the chemical formula of the Zr—O—Si composite oxide can be written as $Zr_zO_2Si_{(1-z)}$, where z is larger than zero and smaller than 1.

The capability of the Zr—O—Si composite oxide to block F atoms from migrating (i.e., the capability to resist F attack) can depend on the airtightness of the Zr—O—Si composite oxide, which may depend on the compactness of the Zr—O—Si composite oxide. A Zr—O—Si composite oxide having a higher compactness can have a higher capability of resisting F attack. In some embodiments, the compactness of the Zr—O—Si composite oxide can depend on the mole ratio of Zr to Si in the composite oxide. The atomic coordination numbers of Zr and Si are 8 and 4, respectively. Therefore, when each O atom is shared by Zr and Si in the Zr—O—Si composite-oxide layer, the Zr—O—Si composite oxide can have Zr—O—Si chemical bonds with a maximum proportionality of Zr to Si of 1:2. That is, the mole ratio of Zr to Si, x:y, is 1:2. Under this condition, the Zr—O—Si composite-oxide layer has a maximum compactness and thus a strongest resistance to the attack by F atoms, and hence can most effectively block F atoms from migrating. In some embodiments, the mole ratio of Zr to Si in the Zr—O—Si composite-oxide layer can be, for example, in a range from approximately 0.3 to approximately 0.7, in a range from approximately 0.4 to approximately 0.6, or in a range from approximately 0.45 to approximately 0.55. In some embodiments, the mole ratio of Zr to Si in the Zr—O—Si composite-oxide layer can be, for example, approximately 0.5.

In some embodiments, the Zr—O—Si composite-oxide layer can be formed by performing an annealing treatment on a composite layer including a $ZrO_2$ layer and a $SiO_2$ layer that are formed one over another. Such a composite layer is also referred to as a $ZrO_2$—$SiO_2$ composite layer in this disclosure. The Zr—O—Si composite-oxide layer can be formed, e.g., at the interface between the $ZrO_2$ layer and the $SiO_2$ layer. The mole ratio of Zr to Si in the Zr—O—Si composite-oxide layer can depend on the time length (time period) and the temperature of the annealing treatment. In some embodiments, the annealing time can be in a range from approximately 30 minutes to approximately 6 hours, and the annealing temperature can be in a range from approximately 500° C. to approximately 1000° C. For example, the $ZrO_2$—$SiO_2$ composite layer can be annealed at approximately 800° C. for approximately 3 hours. Different combinations of annealing time and annealing temperature may result in approximately same Zr to Si mole ratio. For example, to achieve a same Zr to Si mole ratio, the $ZrO_2$—$SiO_2$ composite layer can be annealed at a lower temperature for a longer time period or at a higher temperature for a shorter time period.

In some embodiments, as shown in FIG. 1, the semiconductor device 100 further includes a conducting layer 130 arranged over the hybrid spacer 120. The conducting layer 130 can include, e.g., a semiconductor material (such as polycrystalline silicon, also simply referred to as "polysilicon") and/or a metal (such as tungsten). In some situations, a good electrical insulation between the metal layer 110 and the conducting layer 130 may be needed. $ZrO_2$ in the $ZrO_2$ layer 122 and $Zr_xOSi_y$ in the Zr—O—Si composite-oxide layer 126 can have a higher dielectric constant than the $SiO_2$ in the $SiO_2$ layer 124. Therefore, the hybrid spacer 120 consistent with the disclosure can have a better insulation performance than a spacer made of $SiO_2$ only, and can better prevent current leakage between the metal layer 110 and the conducting layer 130. On the other hand, to achieve the same insulation performance, the hybrid spacer 120 consistent with the disclosure can have a smaller thickness, which can help to further reduce the size of the semiconductor device 100 or to increase degree of integration.

Figure 2A:
FIGS. 2A-2F schematically show a process of forming the semiconductor device according to an embodiment of the disclosure.

FIGS. 2A-2F schematically show an example process of forming the semiconductor device 100 consistent with embodiments of the disclosure. As shown in FIG. 2A, the metal layer 110 is formed. The metal layer 110 can be deposited, e.g., over a substrate (not shown), which can be a semiconductor substrate (e.g., a silicon substrate), a dielectric substrate (e.g., a silicon oxide substrate), or a composite substrate including different materials (e.g., a semiconductor-on-insulator (SOI) substrate). In some embodiments, the metal layer 110 can be a tungsten layer and forming the metal layer 110 can include depositing the tungsten layer by a CVD process or an ALD process using $WF_6$ as the W source.

Figure 2B:
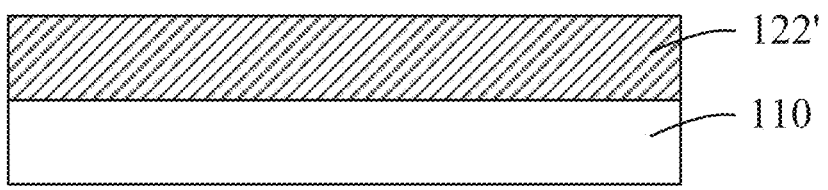

As shown in FIG. 2B, a first dielectric layer 122' (also referred to as a "first raw dielectric layer" or a "first dielectric reaction layer") containing the first dielectric material is formed over the metal layer 110. In some embodiments, the first dielectric material can include $ZrO_2$ and the $ZrO_2$ layer can be formed by, e.g., a CVD process using tetrabutoxyzirconium ($Zr(OC_4H_9)_4$) as a reaction source and at a temperature, e.g., in a range from approximately 300° C. to approximately 500° C.

Figure 2C:
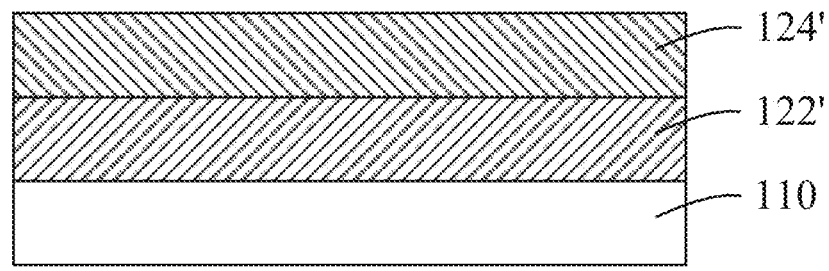

As shown in FIG. 2C, a second dielectric layer 124' (also referred to as a "second raw dielectric layer" or a "second dielectric reaction layer") containing the second dielectric material is formed over the first raw dielectric layer 122'. In some embodiments, the second dielectric material can include $SiO_2$ and the $SiO_2$ layer can be formed by, e.g., a CVD process.

Figure 2D:
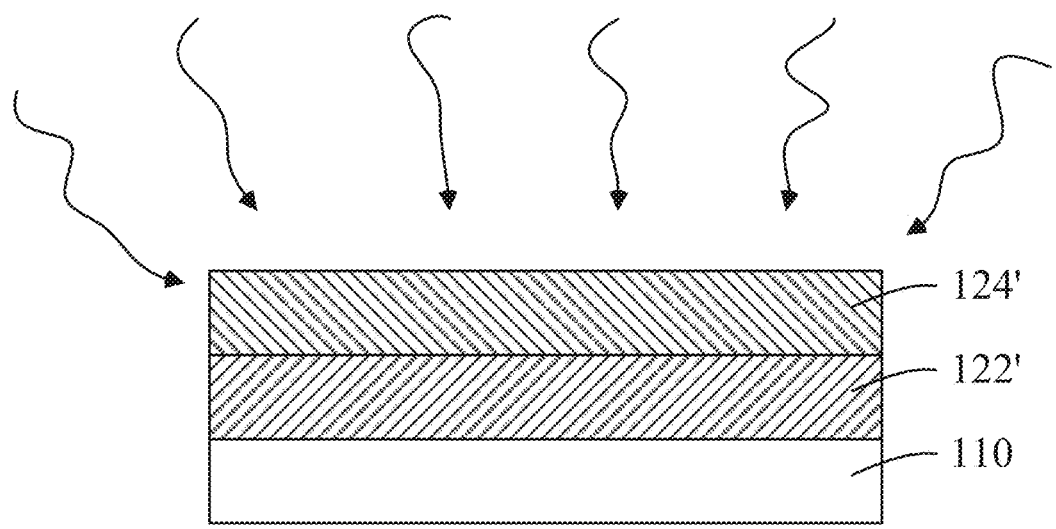
Figure 2E:
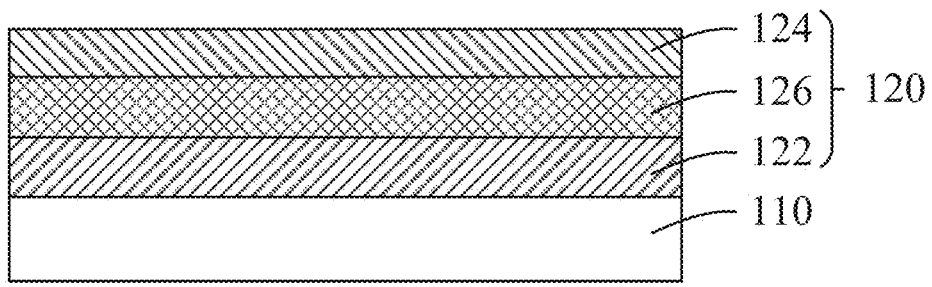

As shown in FIG. 2D, an annealing treatment is performed at a raised temperature for a certain period of time. The annealing treatment can be performed, e.g., in a same chamber for forming the first raw dielectric layer 122' and/or the second raw dielectric layer 124', or in a separate annealing chamber. During the annealing treatment, the first dielectric material and the second dielectric material that are near the interface between the first raw dielectric layer 122' and the second raw dielectric layer 124' can react with each other to form the composite-dielectric material. Thus, at least a portion of the first raw dielectric layer 122' adjacent to the interface and at least a portion of the second raw dielectric layer 124' adjacent to the interface turn into the composite-dielectric layer 126. The composition and thickness of the composite-dielectric layer 126 can depend on various factors, such as the annealing temperature and/or the annealing time. The remaining portion of the first raw dielectric layer 122' constitutes the first dielectric layer 122 and the remaining portion of the second raw dielectric layer 124' constitutes the second dielectric layer 124. As such, the hybrid spacer 120 including the first dielectric layer 122, the second dielectric layer 124, and the composite-dielectric layer 126 is formed, as shown in FIG. 2E. In some other embodiments, one or both of the first and second raw dielectric layers 122' and 124' may be completely converted into the composite-dielectric material, and the resulting spacer would include the composite-dielectric layer 126 and one of the first and second dielectric layers 122 and 124, or include only the composite-dielectric layer 126.

In the embodiments that the first dielectric material includes $ZrO_2$ and the second dielectric material includes $SiO_2$, the $ZrO_2$ and the $SiO_2$ near the interface between the $ZrO_2$ layer and the $SiO_2$ layer can react with each other to form the Zr—O—Si composite-oxide layer. In some embodiments, the annealing time for forming the Zr—O—Si composite-oxide layer can be in a range from approximately 30 minutes to approximately 6 hours, and the annealing temperature can be in a range from approximately 500° C. to approximately 1000° C. For example, the composite layer including the first raw dielectric layer 122' of $ZrO_2$ and the second raw dielectric layer 124' of $SiO_2$ can be annealed at approximately 800° C. for approximately 3 hours. As a result of the annealing process, the mole ratio of Zr to Si in the composite-dielectric layer 126 of Zr—O—Si composite oxide can be, e.g., approximately 1:2, and the mole ratio of Zr+Si to O in the composite-dielectric layer 126 of Zr—O—Si composite oxide can be, e.g., approximately 1:2.

Figure 2F:
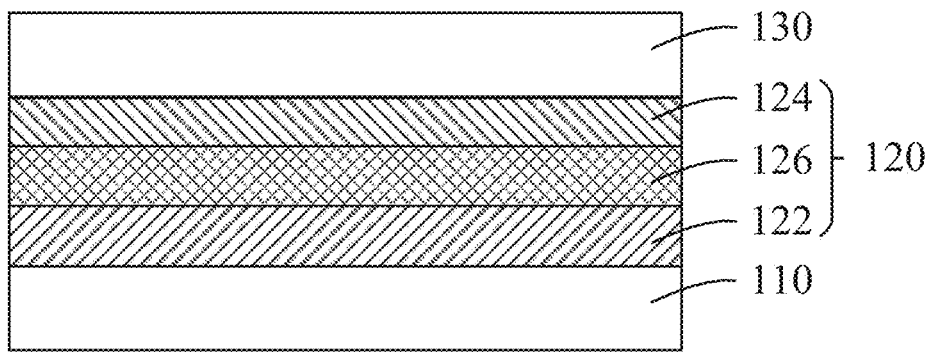

In some embodiments, as shown in FIG. 2F, the conducting layer 130 is formed over the hybrid spacer 120. The conducting layer 130 can include one or more suitable materials and/or one or more sub-layers, and can be formed using corresponding suitable methods. For example, the conducting layer 130 can include a metal layer having a same metal material (such as tungsten) as the metal layer 110, and can be formed using a method similar to that for forming the metal layer 110. As another example, the conducting layer 130 can include a polycrystalline silicon layer and can be formed by, e.g., a CVD process. As a further example, the conducting layer 130 can include a metal sub-layer and a polycrystalline silicon sub-layer arranged one over another or side by side.

In the embodiments described above in connection with FIGS. 2A-2F, the composite-dielectric layer 126 (e.g., a Zr—O—Si composite-oxide layer) is formed by subjecting a composite layer including the first raw dielectric layer 122' (e.g., a $ZrO_2$ layer) and the second raw dielectric layer 124' (e.g., a $SiO_2$ layer) to an annealing treatment to convert portions of the first and second raw dielectric layers 122' and 124' that are adjacent to the interface therebetween into the composite-dielectric layer 126. In some other embodiments, the hybrid spacer 120 can be formed by depositing the first dielectric layer 122, depositing the composite-dielectric layer 126 over the first dielectric layer 122, and then depositing the second dielectric layer 124 over the composite-dielectric layer 126.

FIGS. 2A-2F show an example sequence of processes in the example method for forming the semiconductor device 100. A method consistent with embodiments of the disclosure can be performed in an order different from that shown in FIGS. 2A-2F and described above. For example, in some embodiments, the annealing treatment for converting the at least a portion of the first raw dielectric layer 122' and the at least a portion of the second raw dielectric layer 124' into the composite-dielectric layer 126 can be performed after the conducting layer 130 is formed. Further, one or more of the processes shown in FIGS. 2A-2F and described above may be omitted, and the method for forming the semiconductor device 100 can include additional process(es) not shown or described.

In the embodiments described above in connection with FIGS. 1 and 2A-2F, the hybrid spacer 120 includes the first dielectric layer 122, the second dielectric layer 124, and the composite-dielectric layer 126. In some other embodiments, a spacer consistent with the disclosure can include two or less of the above three layers. For example, the spacer consistent with the disclosure can include the first dielectric layer 122 (e.g., the $ZrO_2$ layer) and the composite-dielectric layer 126 (e.g., the Zr—O—Si composite-oxide layer), include the composite-dielectric layer 126 (e.g., the Zr—O—Si composite-oxide layer) and the second dielectric layer 124 (e.g., the $SiO_2$ layer), or include the composite-dielectric layer 126 (e.g., the Zr—O—Si composite-oxide layer) only. For example, during the annealing process, the annealing temperature and/or the annealing time can be controlled such that either or both of the first raw dielectric layer 122' and the second raw dielectric layer 124' are completely consumed, e.g., converted to portions of the composite-dielectric layer 126.

Figure 3:
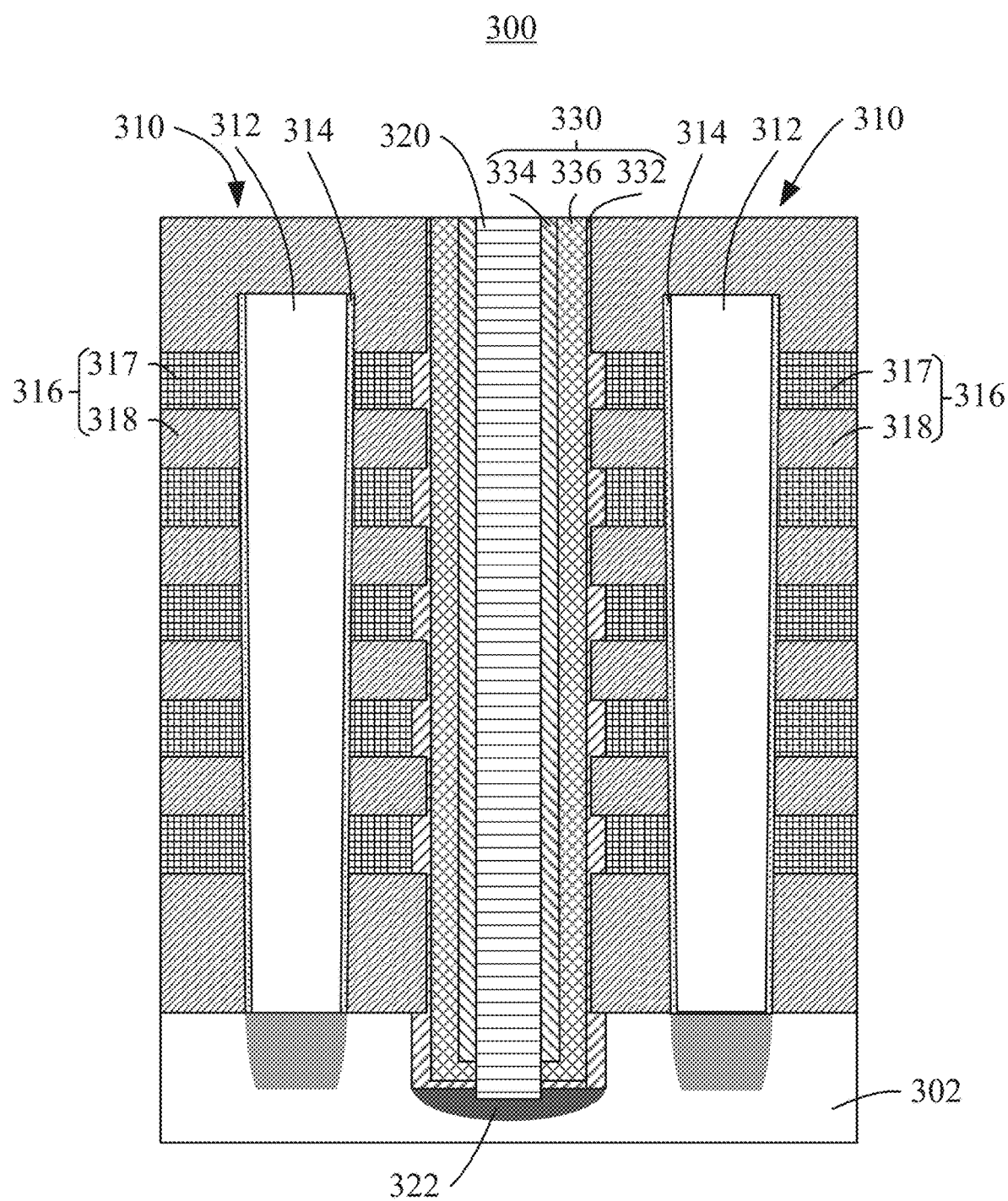
FIG. 3 is a cross-sectional view of a portion of a memory device according to an embodiment of the disclosure.

FIG. 3 is a cross-sectional view of a portion of an example 3D memory device 300 consistent with embodiments of the disclosure. The memory device 300 can be, e.g., a 3D NAND-type memory device. The 3D memory device 300 includes a substrate 302. The substrate 302 can include a semiconductor material (such as silicon, germanium, silicon germanium, gallium arsenide, or indium phosphide) or a dielectric material (such as oxide or nitride of a semiconductor, e.g., silicon oxide or silicon nitride, or plastic). In some embodiments, the substrate 302 can include a composite substrate including different materials, such as silicon on insulator (SOI). In some embodiments, other structures can be formed on or in the substrate 302.

In the example shown in FIG. 3, the 3D memory device 300 is a NAND-type memory device including a plurality of NAND strings 310 extending vertically above the substrate 302. Each of the NAND strings 310 includes a semiconductor channel 312, a dielectric layer 314 (also referred to as a "memory film"), and a plurality of metal/dielectric tiers 316. The dielectric layer 314 can be sandwiched between the semiconductor channel 312 and the metal/dielectric tiers 316. In some embodiments, the semiconductor channel 312 can have a pillar or column structure extending approximately vertically above the substrate 302 and approximately perpendicular to the plurality of metal/dielectric tiers 316. The dielectric layer 314 can surround the semiconductor channel 312.

The semiconductor channel 312 can include a semiconductor material, such as silicon (e.g., amorphous silicon, polycrystalline silicon, or single crystalline silicon). In some embodiments, the dielectric layer 314 can include a composite layer including a tunneling layer, a storage layer (also referred to as a "charge trap/storage layer"), and a blocking layer arranged in this order along a direction from the semiconductor channel 312 toward the plurality of metal/ dielectric tiers 316. The tunneling layer, the storage layer, and the blocking layer can be formed of same or different dielectric materials. For example, the tunneling layer can include at least one of silicon oxide or silicon nitride, the storage layer can include at least one of silicon nitride, silicon oxynitride, or silicon, and the blocking layer can include at least one of silicon oxide, silicon nitride, or a high dielectric constant (high-k) material.

As shown in FIG. 3, each of the metal/dielectric tiers 316 includes a metal layer 317 and a dielectric layer 318 (also referred to as "inter-metal dielectric layer"). That is, the plurality of metal/dielectric tiers 316 include a plurality of metal layers 317 and a plurality of dielectric layers 318 that are arranged alternately in the vertical direction shown in FIG. 3. At least some of the metal layers 317 are each sandwiched by two neighboring dielectric layers 318, and at least some of the dielectric layers 318 are each sandwiched by two neighboring metal layers 317.

The dielectric layers 318 can include one or more dielectric materials, such as one or more of silicon oxide, silicon nitride, and silicon oxynitride. The metal layers 317 can include a metal, such as tungsten (W). Each metal layer 317 and the corresponding portions in the semiconductor channel 312 and the dielectric layer 314 can together constitute a memory cell of the 3D memory device 300. In this memory cell, the metal layer 317 can function as a gate, such as a control gate.

During the formation of the metal layers 317, some residual atoms from the source of the metal that are different from the metal atoms may remain in the metal layers 317 or be trapped by voids formed in the metal layers 317. These residual atoms may migrate to other parts of the memory device 300 and cause degradation in properties or functionalities of these parts, or may even damage these parts. For example, the metal layers 317 can include tungsten (W) and the metal layers 317 can be formed by a chemical vapor deposition (CVD) method or an atomic layer deposition (ALD) method using tungsten hexafluoride ($WF_6$) as the source of tungsten. The fluorine (F) atoms may remain in the tungsten metal layers 317 or be trapped by voids in the tungsten metal layers 317.

As shown in FIG. 3, the memory device 300 further includes a via contact 320 extending vertically through the plurality of metal/dielectric tiers 316. In the example shown in FIG. 3, the via contact 320 contacts and is electrically coupled to a doped region 322 (e.g., an array common source) formed in the substrate 302, and hence can also be referred to as a "source contact." The via contact 320 can include one or more conducting materials, such as one or more of tungsten, copper, aluminum, cobalt, silicon (e.g., polycrystalline silicon), and metal silicides. In some embodiments, the via contact 320 can include multiple layers arranged one over another. For example, the via contact 320 can include a metal layer (such as a tungsten layer) and a polycrystalline silicon layer, and the metal layer is arranged over the polycrystalline silicon layer, i.e., the polycrystalline silicon layer is arranged between the metal layer and the doped region 322.

The memory device 300 further includes a hybrid spacer 330 separating the via contact 320 from neighboring NAND strings 310, and hence separating the via contact 320 from the metal layers 317 of the neighboring NAND strings 310. In some embodiments, the hybrid spacer 330 can electrically isolate the via contact 320 from the metal layers 317 of the neighboring NAND strings 310. In some embodiments, the via contact 320 can have a pillar or column structure and the hybrid spacer 330 can surround the via contact 320.

To avoid short circuit, a good electric isolation between the via contact 320 and the metal layers 317 may be needed, and current leakage between the via contact 320 and the metal layers 317 may need to be prevented. As described above, the residual atoms, such as F atoms, remaining in the metal layers 317 (such as tungsten layers 317) or trapped by the voids in the metal layers 317 may migrate to other parts of the memory device 300. The hybrid spacer 330 consistent with embodiments of the present disclosure can effectively prevent or reduce the migration of these residual atoms, such as F atoms, from the metal layers 317.

As shown in FIG. 3, the hybrid spacer 330 includes a first dielectric layer 332 at one side of the hybrid spacer 330 that is proximal to the metal layers 317, a second dielectric layer 334 at another side of the hybrid spacer 330 that is distal from the metal layers 317 (i.e., the side of the hybrid spacer 330 that is proximal to the via contact 320), and a composite-dielectric layer 336 sandwiched between the first dielectric layer 332 and the second dielectric layer 334. According to the present disclosure, the first dielectric layer 332 can include a first dielectric material and the second dielectric layer 334 can include a second dielectric material that can be different from the first dielectric material. The composite-dielectric layer 336 can include a composite material that is a composite of the first dielectric material and the second dielectric material. For example, the composition of the composite material can be a mixture of the compositions of the first and second dielectric materials. In some embodiments, the composite-dielectric layer 336 can be formed by, e.g., annealing a layer of the first dielectric material and a layer of the second dielectric material formed one in contact with another, e.g., at an interface between the layer of the first dielectric material and the layer of the second dielectric material.

In some embodiments, the first dielectric layer 332 can include, e.g., a zirconium oxide layer containing zirconium oxide ($ZrO_2$), and the second dielectric layer 334 can include, e.g., a silicon oxide layer containing silicon oxide ($SiO_2$). Correspondingly, the composite-dielectric layer 336 can include a Zr—O—Si composite-oxide layer containing Zr—O—Si composite oxide.

The hybrid spacer 330 of the memory device 300 can have a same or similar structure and material composition as the hybrid spacer 120 of the semiconductor device 100 described above, and can be formed using a same or similar method as the hybrid spacer 120. The first dielectric layer 332, the second dielectric layer 334, and the composite-dielectric layer 336 of the hybrid spacer 330 can have same or similar material compositions as the first dielectric layer 122, the second dielectric layer 124, and the composite-dielectric layer 126 of the hybrid spacer 120 described above. Therefore, for the structure, composition, formation, properties, characteristics, and functions of the hybrid spacer 330, as well as of the first dielectric layer 332, the second dielectric layer 334, and the composite-dielectric layer 336, that are not explicitly described in this disclosure, reference can be made to those of the hybrid spacer 120, as well as the first dielectric layer 122, the second dielectric layer 124, and the composite-dielectric layer 126, described above.

Figure 4A:
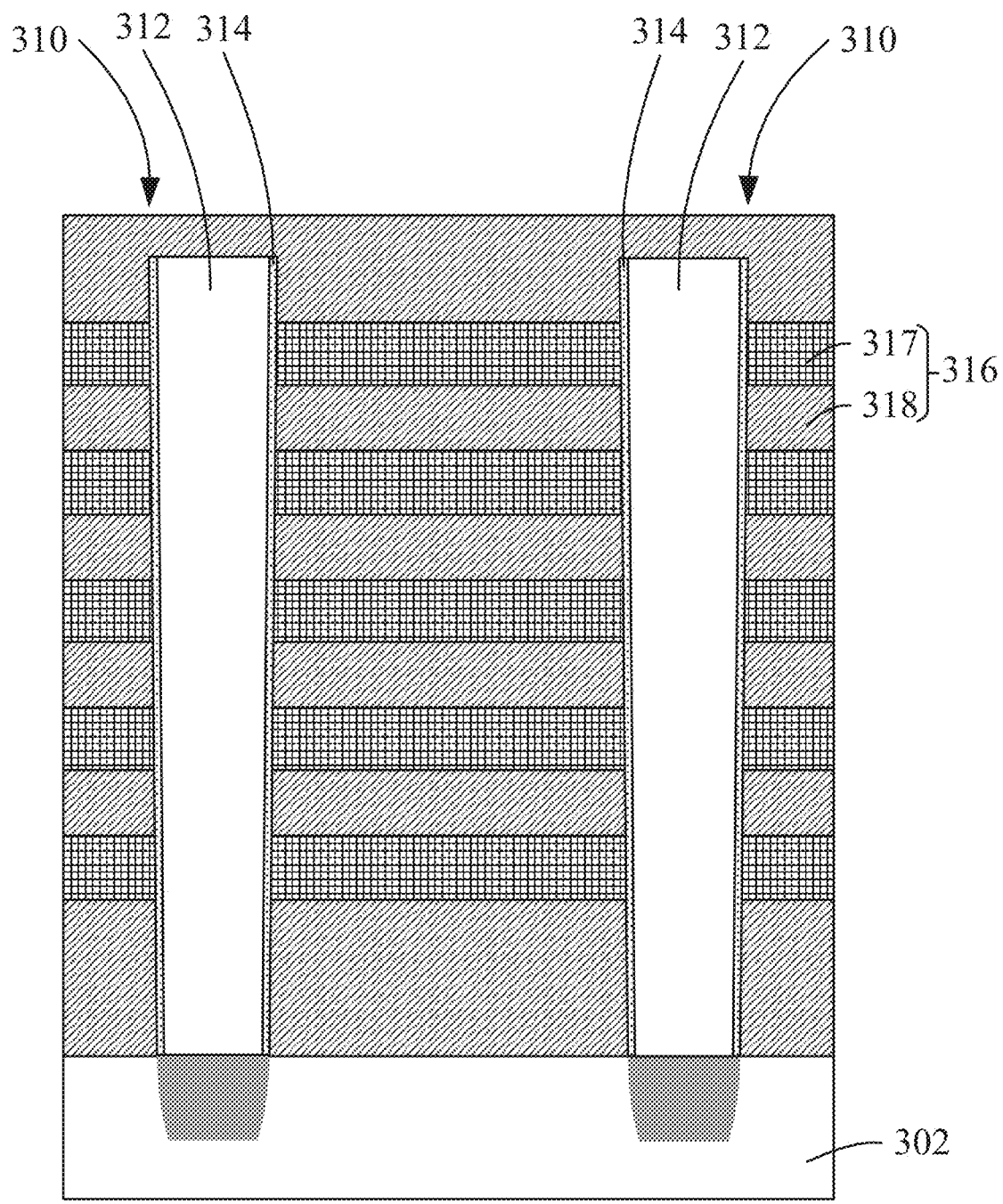
FIGS. 4A-4G schematically show a process of forming the memory device according to an embodiment of the disclosure.

FIGS. 4A-4G schematically show an example process of forming the memory device 300 consistent with embodiments of the disclosure. As shown in FIG. 4A, a memory cell region is formed over the substrate 302 for further processing as will be described below. The memory cell region includes a plurality of semiconductor channels 312, a plurality of dielectric layers 314 (memory films), and a plurality of metal/dielectric tiers 316. The metal/dielectric tiers 316 includes alternately arranged metal layers 317 and dielectric layers 318. The memory cell region can be formed by, e.g., alternately depositing the metal layers 317 and the raw dielectric layers 318 using, e.g., CVD, PVD, and/or ALD process, to form the plurality of metal/dielectric tiers 316, etching through the plurality of metal/dielectric tiers 316 to form via holes, and depositing materials of the memory films 314 and the semiconductor channels 312 sequentially into the via holes. Detailed description of forming the memory cell region is omitted.

Figure 4B:
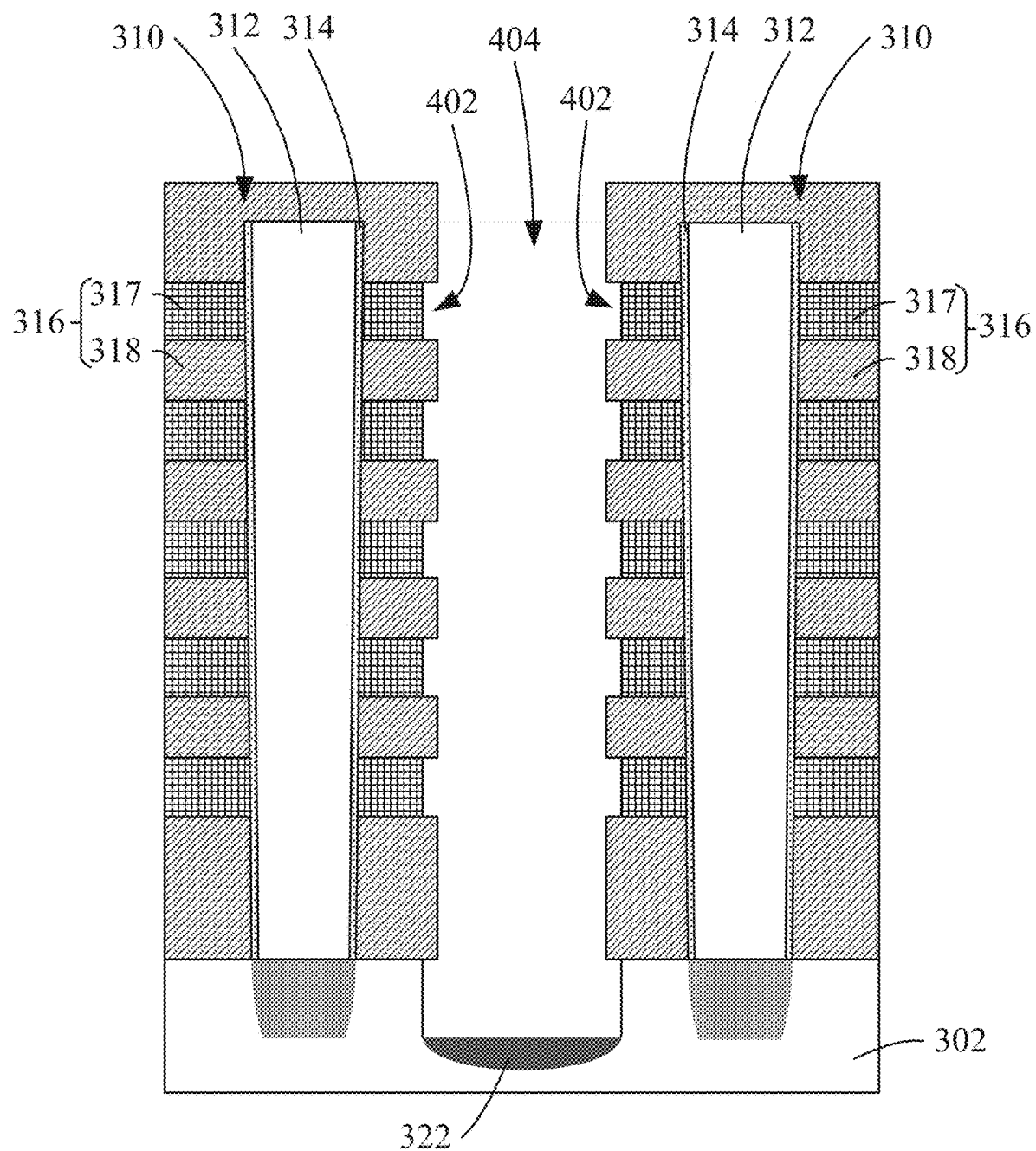

After the memory cell region is formed, an etching process, including wet and/or dry etching, is performed to etch through the entire metal/dielectric tiers 316 all the way to the substrate 302, as shown in FIG. 4B. A portion of the substrate 302 is also etched away by the etching process. In some embodiments, as shown in FIG. 4B, portions of the metal layers 317 are also etched away to form gate recesses 402. As a result of the etching process, an opening (gate line slit) 404 is formed that extends vertically through the metal/dielectric tiers 316. The plurality of metal/dielectric tiers 316 including the alternately arranged metal layers 317 and dielectric layers 318 surround the opening 404. In some embodiments, impurities, such as phosphorus particles, boron particles, and/or arsenic particles, are doped into the portion of the substrate 302 that is exposed by the opening 404, forming the doped region 322, as shown in FIG. 4B. The impurities can be doped in to the substrate 302 by, e.g., implantation and/or diffusion. The doped region 322 can serve as the array common source for the resulting memory device.

Figure 4C:
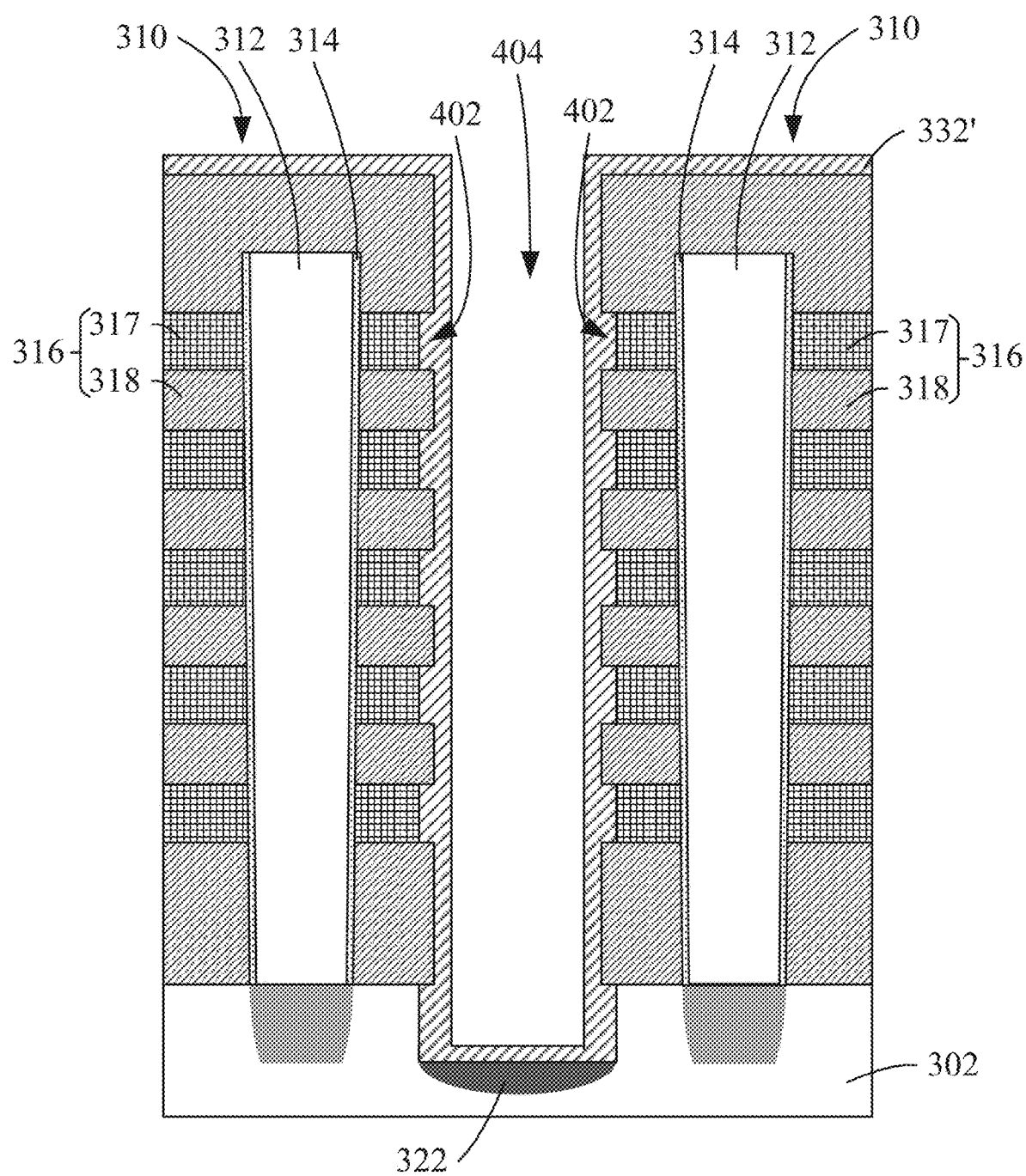

After the opening 404 is formed, a first raw dielectric layer 332' containing a first dielectric material is formed over the device, as shown in FIG. 4C. The first raw dielectric layer 332' can cover the upper surface of the memory cell region and the exposed inner side and bottom surfaces of the opening 404, and fill the gate recesses 402. Therefore, as shown in FIG. 4C, the first raw dielectric layer 332' covers (seals) the metal layers 317.

The first raw dielectric layer 332' can be formed by, e.g., a CVD, PVD, or ALD process. In some embodiments, the first dielectric material can include $ZrO_2$ and the first raw dielectric layer 332' of $ZrO_2$ can be formed by, e.g., a CVD process using tetrabutoxyzirconium ($Zr(OC_4H_9)_4$) as a reaction source and at a temperature of, e.g., approximately 300° C. to approximately 500° C.

Figure 4D:
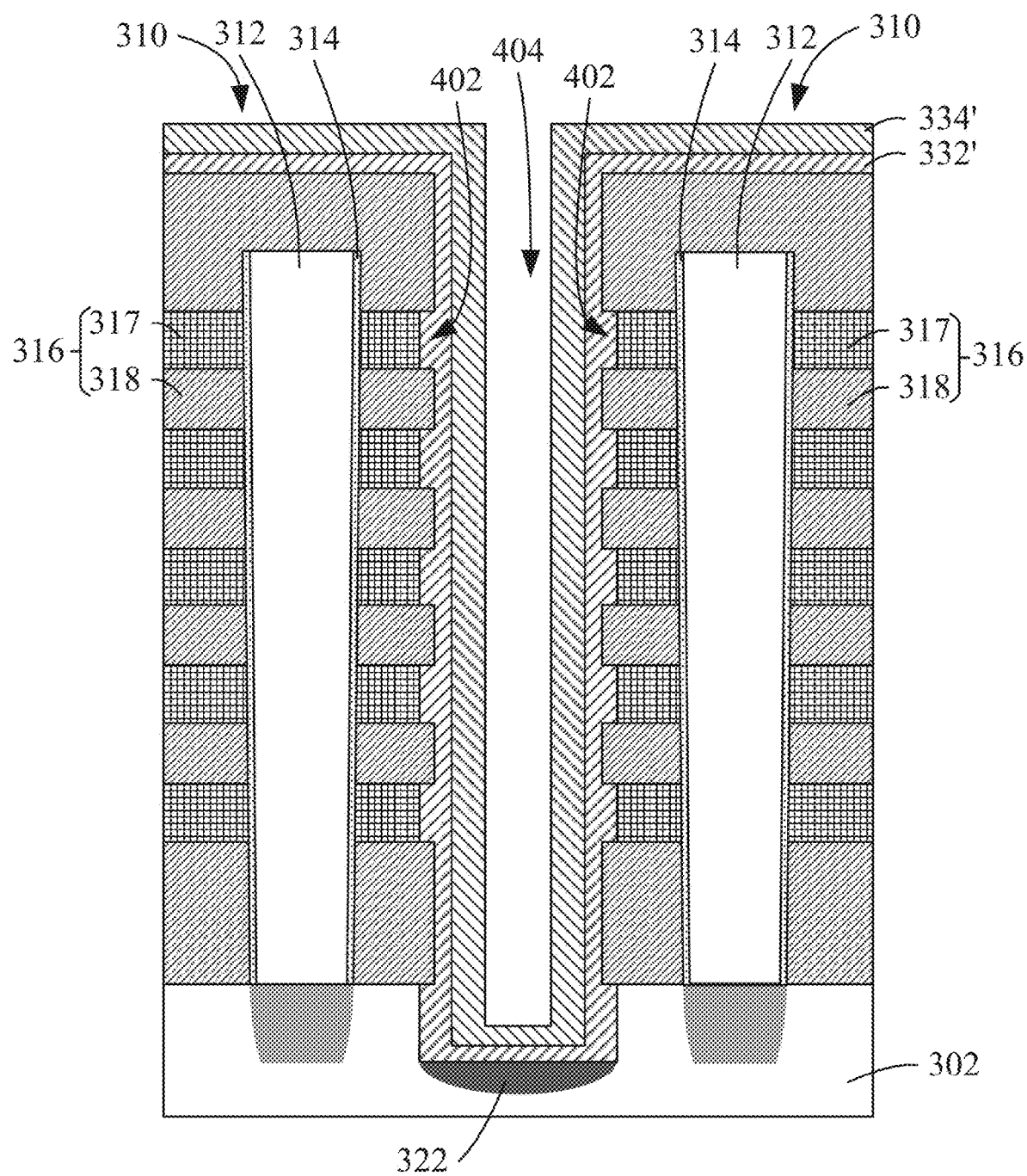

Further, as shown in FIG. 4D, a second raw dielectric layer 334' containing a second dielectric material is formed over the first raw dielectric layer 332' and covers the first raw dielectric layer 332'. In some embodiments, the second raw dielectric layer 334' can be in direct contact with the first raw dielectric layer 332', with an interface therebetween.

The second dielectric material can be different from the first dielectric material, and can react with the first dielectric material to form a composite-dielectric material. The second raw dielectric layer 334' can be formed by, e.g., a CVD, PVD, or ALD process. In some embodiments, the second dielectric material can include $SiO_2$ and the second raw dielectric layer 334' of $SiO_2$ can be formed by, e.g., a CVD process.

Figure 4E:
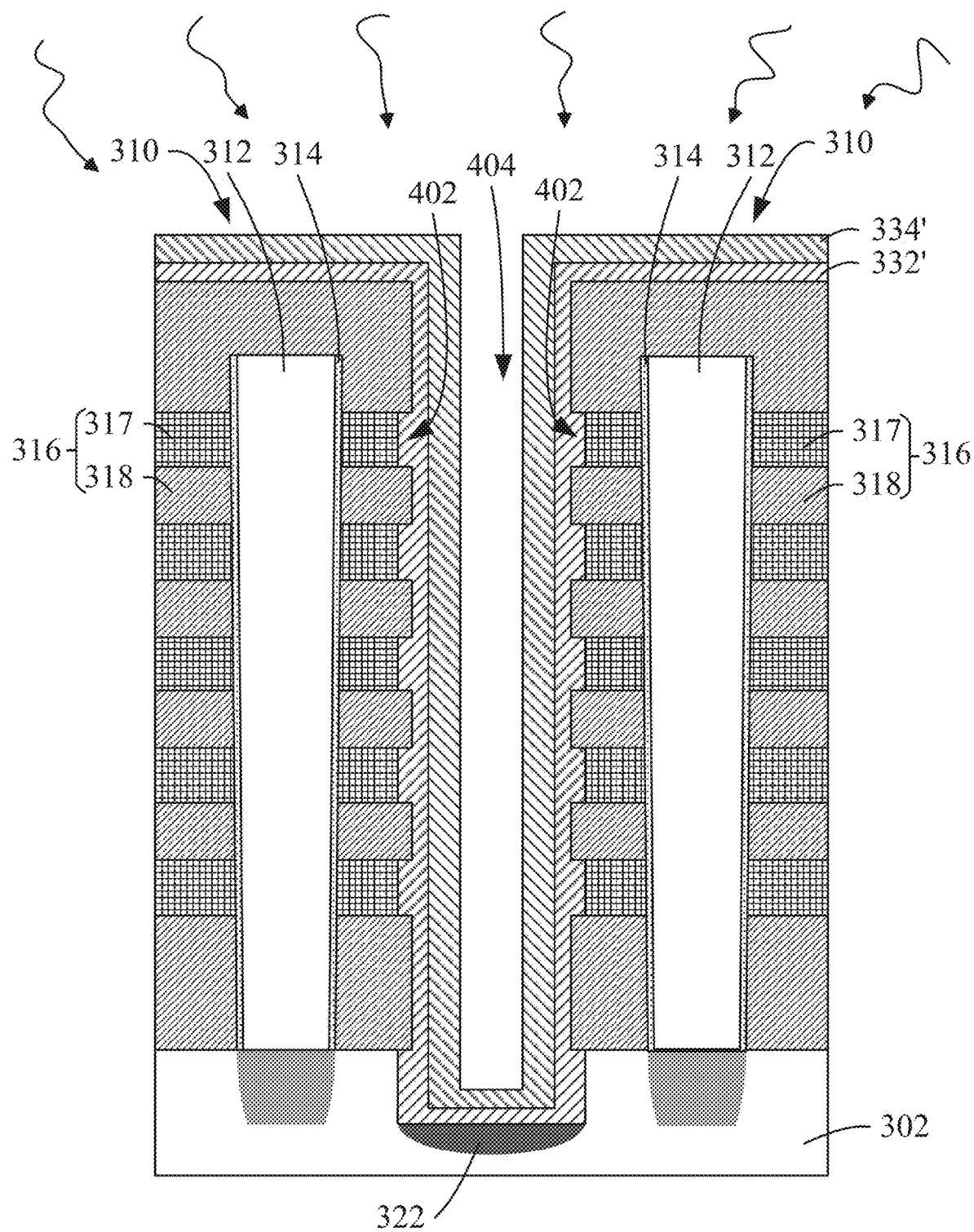
Figure 4F:
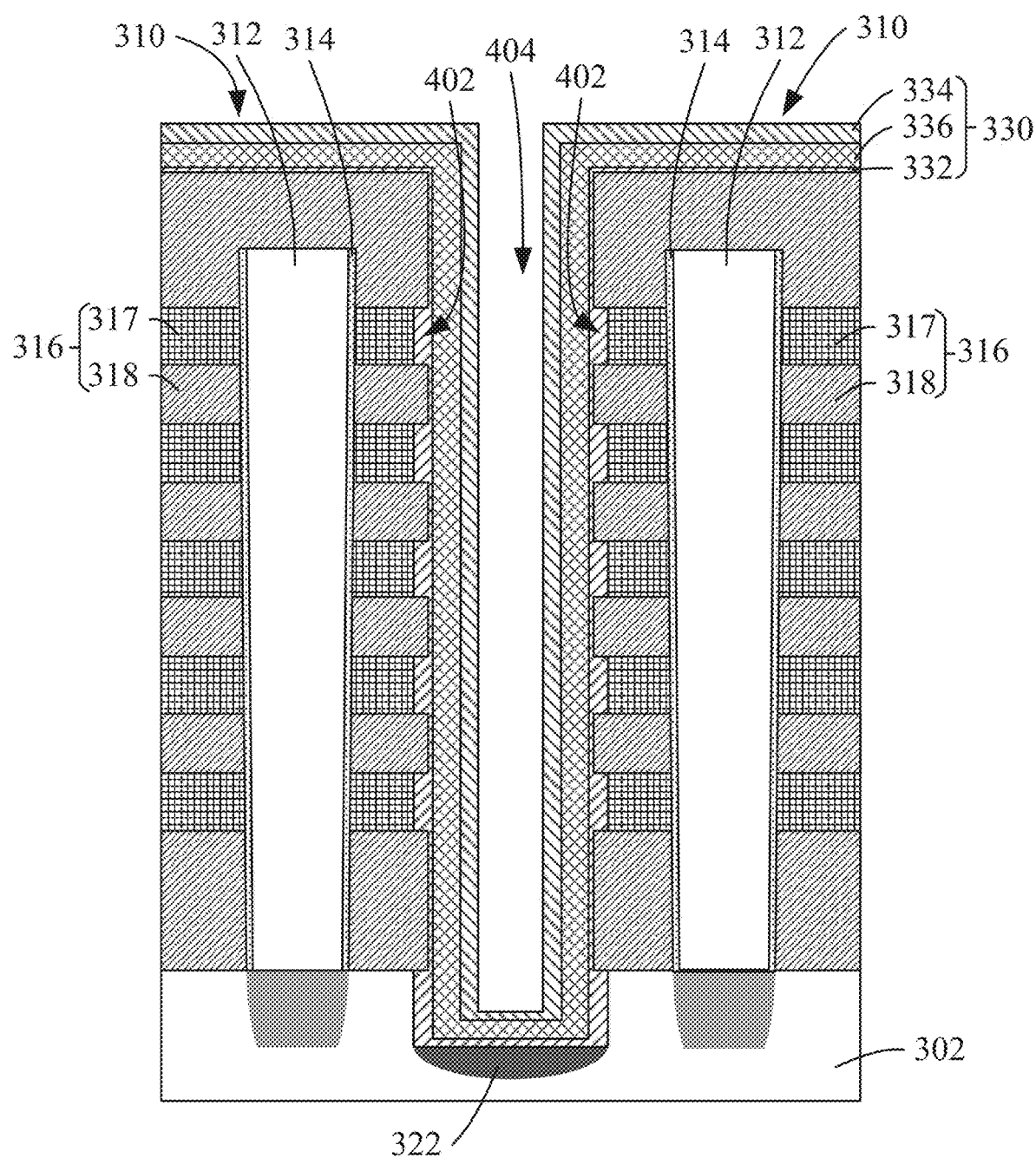

After the second raw dielectric layer 334' is formed, an annealing treatment is performed on the structure at a raised temperature for a certain period of time, as shown in FIG. 4E. The annealing treatment can be performed, e.g., in a same chamber for forming the first raw dielectric layer 332' and/or the second raw dielectric layer 334', or in a separate annealing chamber. During the annealing treatment, the first dielectric material and the second dielectric material that are near the interface between the first raw dielectric layer 332' and the second raw dielectric layer 334' can react with each other to form the composite-dielectric material. That is, at least a portion of the first raw dielectric layer 332' adjacent to the interface and at least a portion of the second raw dielectric layer 334' adjacent to the interface are converted into the composite-dielectric layer 336. The composition and thickness of the composite-dielectric layer 336 can depend on various factors, such as the annealing temperature and/or the annealing time. The remaining portion of the first raw dielectric layer 332' that is not converted into the composite-dielectric material constitutes the first dielectric layer 332. Similarly, the remaining portion of the second raw dielectric layer 334' that is not converted into the composite-dielectric material constitutes the second dielectric layer 334. As a result of the annealing treatment, the hybrid spacer 330 including the first dielectric layer 332, the second dielectric layer 334, and the composite-dielectric layer 336 is formed, as shown in FIG. 4F. In some other embodiments, one or both of the first and second raw dielectric layers 332' and 334' may be completely converted into the composite-dielectric material, and the resulting spacer would include the composite-dielectric layer 336 and one of the first and second dielectric layers 332 and 334, or include only the composite-dielectric layer 336.

Similar to the embodiments described above in connection with FIGS. 1 and 2A-2F, in the embodiments that the first dielectric material includes $ZrO_2$ and the second dielectric material includes $SiO_2$, the $ZrO_2$ and the $SiO_2$ near the interface between the first raw dielectric layer 332' of $ZrO_2$ and the second raw dielectric layer 334' of $SiO_2$ can react with each other to form the composite-dielectric layer 336 of Zr—O—Si composite oxide. In some embodiments, the annealing time for forming the composite-dielectric layer 336 of Zr—O—Si composite oxide can be in a range from approximately 30 minutes to approximately 6 hours, and the annealing temperature can be in a range from approximately 500° C. to approximately 1000° C. For example, the first raw dielectric layer 332' of $ZrO_2$ and the second raw dielectric layer 334' of $SiO_2$ can be annealed at approximately 800° C. for approximately 3 hours. As a result of the annealing process, the mole ratio of Zr to Si in the composite-dielectric layer 336 of Zr—O—Si composite oxide can be, e.g., approximately 1:2, and the mole ratio of Zr+Si to O in the composite-dielectric layer 336 of Zr—O—Si composite oxide can be, e.g., approximately 1:2.

The compositions and material structure of the hybrid spacer 330 of the memory device 300 and the processes of forming the hybrid spacer 330 can be the same as or similar to those of the hybrid spacer 120 described above in connection with FIGS. 1 and 2A-2F. Thus, some detailed descriptions about the hybrid spacer 330 are omitted and reference can be made to those above related to the hybrid spacer 120.

Figure 4G:
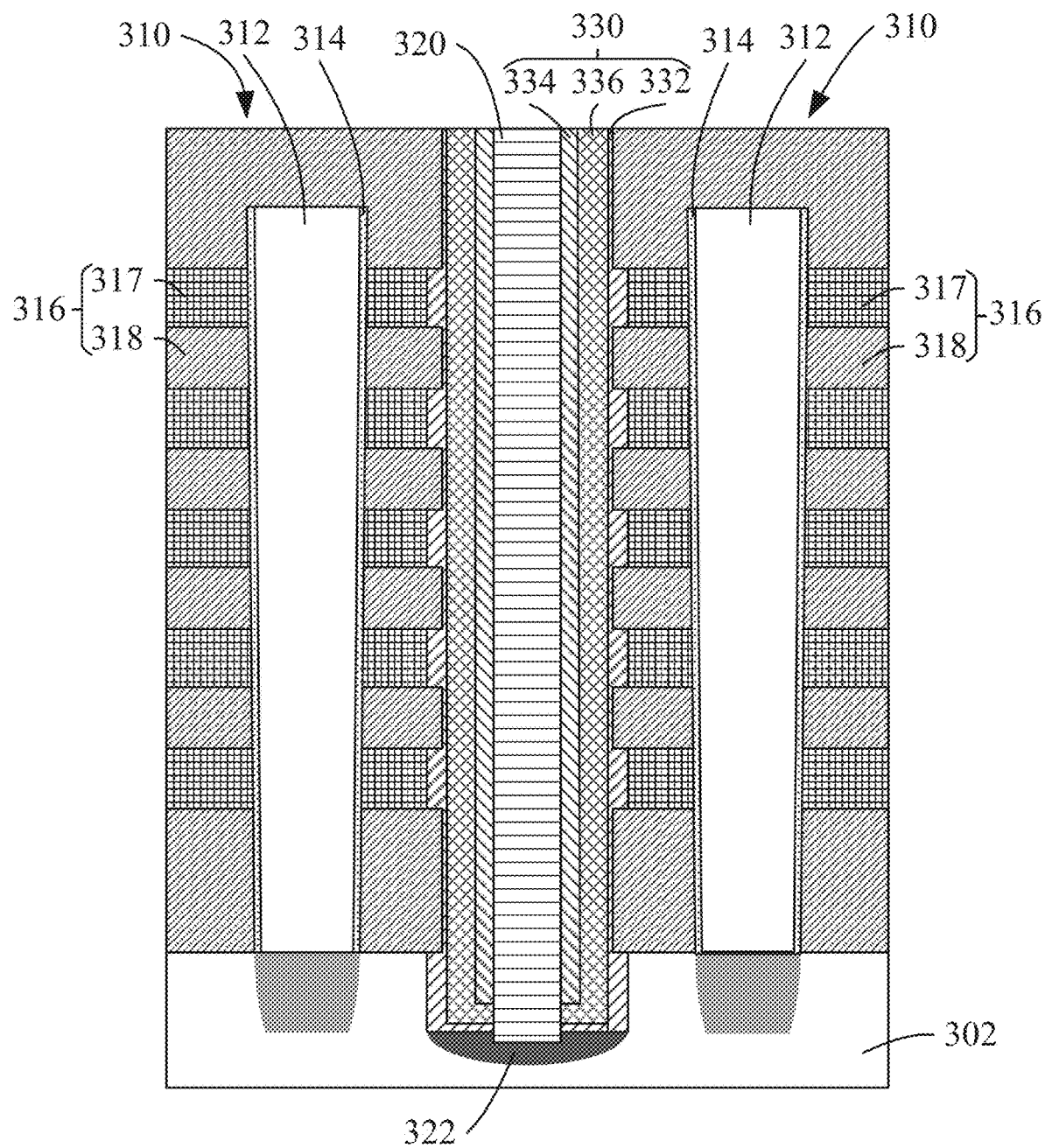

After the hybrid spacer 330 is formed, one or more conducting materials are filled in the opening 404 to form the via contact 320 that is electrically coupled to the doped region 322, as shown in FIG. 4G. The one or more conducting materials can be filled into the opening 404 by, e.g., one or more of a CVD, a PVD, an ALD, and an electroplating processes.

In some embodiments, before the one or more conducting materials are deposited, at least a portion of the hybrid spacer 330 on the bottom of the opening 404 can be removed by, e.g., etching, to allow the via contact 320 to electrically contact the doped region 322. In some embodiments, before the one or more conducting materials are deposited, the hybrid spacer 330 on the top surface of the device can be removed. In some other embodiments, the hybrid spacer 330 on the top surface of the device can be removed after the one or more conducting materials are deposited.

The via contact 320 can include one or more suitable conducting materials and/or one or more layers, and can be formed using corresponding suitable methods. For example, the via contact 320 can include a metal layer having a same metal material (such as tungsten) as the metal layers 317, and can be formed using a method similar to that for forming the metal layers 317. As another example, the via contact 320 can include a polycrystalline silicon layer and can be formed by, e.g., a CVD process. In some embodiments, the via contact 320 can include a metal layer (such as a tungsten layer) and a polycrystalline silicon layer arranged one over another or side by side. For example, polycrystalline silicon can be first deposited into the opening 404 to form a polycrystalline silicon layer and then metal (such as tungsten) can be deposited into the opening 404 to form a metal layer (such as a tungsten layer). The resulting via contact 320 includes the metal layer (such as the tungsten layer) over the polycrystalline silicon layer.

FIGS. 4A-4G show an example sequence of processes in the example method for forming the memory device 300. A method consistent with embodiments of the present disclosure can be performed in an order different from that shown in FIGS. 4A-4G and described above. For example, in some embodiments, the annealing treatment for converting the at least a portion of the first raw dielectric layer 332' and the at least a portion of the second raw dielectric layer 334' into the composite-dielectric layer 336 can be performed after the via contact 320 is formed. Further, the fabrication of the memory device 300 can also include other processes such as forming metal contacts and peripheral circuits. Detailed descriptions of such processes are omitted in this disclosure.

Although the principles and implementations of the present disclosure are described by using specific embodiments in the specification, the foregoing descriptions of the embodiments are only intended to help understand the method and core idea of the method of the present disclosure. Meanwhile, a person of ordinary skill in the art may make modifications to the specific implementations and application range according to the idea of the present disclosure. In conclusion, the content of the specification should not be construed as a limitation to the present disclosure.

What is claimed is:
1. A semiconductor device comprising:
   a metal layer; and a spacer arranged adjacent to the metal layer, the spacer including a composite-dielectric layer including a composite-dielectric material, and a composition of the composite-dielectric material being a mixture of a composition of a first dielectric material and a composition of a second dielectric material different from the first dielectric material, wherein the spacer further includes:
  a first dielectric layer arranged at a side of the composite-dielectric layer proximal to the metal layer and including the first dielectric material; and
  a second dielectric layer arranged at another side of the composite-dielectric layer distal from the metal layer and including the second dielectric material.

2. The semiconductor device of claim 1, wherein the spacer further includes another dielectric layer including the first dielectric material or the second dielectric material.

3. The semiconductor device of claim 1, wherein:
the first dielectric material includes zirconium oxide;
the second dielectric material includes silicon oxide; and
the composite-dielectric material includes zirconium-oxygen-silicon composite oxide.

4. The semiconductor device of claim 1, wherein the metal layer includes tungsten.

5. A memory device comprising:
  a substrate;
  a plurality of metal/dielectric tiers arranged over the substrate, each of the metal/dielectric tiers including a metal layer and an inter-metal dielectric layer;
  a via contact arranged through the metal/dielectric tiers; and
  a spacer arranged between the metal/dielectric tiers and the via contact, the spacer including a composite-dielectric layer including a composite-dielectric material, and a composition of the composite-dielectric material being a mixture of a composition of a first dielectric material and a composition of a second dielectric material different from the first dielectric material, wherein the composite-dielectric material has a higher compactness than the first dielectric material and the second dielectric material.

6. The memory device of claim 5, wherein the spacer further includes another dielectric layer including the first dielectric material or the second dielectric material, the another dielectric layer being arranged at a side of the composite-dielectric layer proximal to the metal/dielectric tiers or at another side of the composite-dielectric layer distal from the metal/dielectric tiers.

7. The memory device of claim 5, wherein the spacer further includes:
  a first dielectric layer arranged at a side of the composite-dielectric layer proximal to the metal/dielectric tiers and including the first dielectric material; and
  a second dielectric layer arranged at another side of the composite-dielectric layer distal from the metal/dielectric tiers and including the second dielectric material.

8. The memory device of claim 5, wherein:
the first dielectric material includes zirconium oxide;
the second dielectric material includes silicon oxide; and
the composite-dielectric material includes zirconium-oxygen-silicon composite oxide.

9. The memory device of claim 8, wherein a mole ratio of zirconium to silicon in the zirconium-oxygen-silicon composite oxide is in a range from approximately 0.3 to approximately 0.7.

10. The memory device of claim 5, wherein the metal layer includes tungsten.

11. The memory device of claim 5, wherein the via contact includes at least one of tungsten or polycrystalline silicon.

12. A memory device comprising:
  a plurality of metal/dielectric tiers, each of the metal/dielectric tiers including a metal layer and an inter-metal dielectric layer; and
  a spacer comprising:
    a first dielectric layer disposed adjacent to the metal/dielectric tiers,
    a second dielectric layer, and
    a composite-dielectric layer arranged between the first dielectric layer and the second dielectric layer and including a composition being a mixture of a composition of a material of the first dielectric layer and a composition of a material of the second dielectric layer, wherein the material of the first dielectric layer is different than the material of the second dielectric layer, wherein:
      the first dielectric layer, the second dielectric layer, and the composite-dielectric layer extend through the plurality of metal/dielectric tiers.

13. The memory device of claim 5, further comprising:
  a semiconductor channel arranged through the metal/dielectric tiers, the semiconductor channel including a semiconductor material; and
  a memory film between the semiconductor channel and the metal/dielectric tiers.

14. The memory device of claim 13, wherein the memory film includes a tunneling layer, a storage layer, and a blocking layer arranged in this order along a direction from the semiconductor channel toward the metal/dielectric tiers.

15. The memory device of claim 13, wherein the semiconductor channel has a pillar structure, and the memory film surrounds the semiconductor channel.

16. The semiconductor device of claim 1, wherein the composite-dielectric material has a higher compactness than the first dielectric material and the second dielectric material.

17. The semiconductor device of claim 3, wherein a mole ratio of zirconium to silicon in the zirconium-oxygen-silicon composite oxide is in a range from approximately 0.3 to approximately 0.7.

18. The memory device of claim 5, wherein:
the via contact has a pillar structure and the spacer surrounds the via contact.

19. The memory device of claim 12, further comprising:
  a semiconductor channel arranged through the metal/dielectric tiers, the semiconductor channel including a semiconductor material; and
  a memory film between the semiconductor channel and the metal/dielectric tiers.

20. The memory device of claim 12, wherein:
the material of the first dielectric layer includes zirconium oxide;
the material of the second dielectric layer includes silicon oxide; and
the material of the composite-dielectric layer includes zirconium-oxygen-silicon composite oxide.

* * * * *